United States Patent [19]

Lienhard et al.

[11] Patent Number: 4,506,214
[45] Date of Patent: Mar. 19, 1985

[54] MEASURING TRANSFORMER

[75] Inventors: Heinz Lienhard, Zug; Gernot Schneider, Baar, both of Switzerland

[73] Assignee: LGZ Landis & Gyr Zug AG, Zug, Switzerland

[21] Appl. No.: 303,076

[22] Filed: Sep. 17, 1981

Related U.S. Application Data

[62] Division of Ser. No. 918,446, Jun. 23, 1978.

[30] Foreign Application Priority Data

Jul. 8, 1977 [CH] Switzerland .......................... 8455/77
May 24, 1978 [CH] Switzerland .......................... 5644/78

[51] Int. Cl.³ .......................... G01R 1/20; G01R 33/00
[52] U.S. Cl. .................................. 324/117 R; 324/127; 324/249
[58] Field of Search ............... 324/117 R, 117 H, 127, 324/249, 252; 336/223, 225, 231

[56] References Cited

U.S. PATENT DOCUMENTS 3,812,428 5/1974 Trenkler .............................. 324/127

FOREIGN PATENT DOCUMENTS 1392656 2/1964 France .
1453011 11/1965 France .
750109 6/1956 United Kingdom .
1007889 10/1965 United Kingdom .
1229154 4/1971 United Kingdom .
1335472 10/1973 United Kingdom .

OTHER PUBLICATIONS

Schernus et al; "A New Digital Method . . . "; IEEE Trans. on Instrumentation and Measurement; vol. IM-21; No. 4; Nov. 1972; pp. 346-349.

Primary Examiner—Ernest F. Karlsen
Attorney, Agent, or Firm—Morgan, Finnegan, Pine, Foley & Lee

[57] ABSTRACT

A measuring transformer comprises a measuring conductor carrying the current $I_m$ to be measured, a pre-magnetizing winding which carries a pre-magnetizing current $I_v$, and a magnetic field comparing means which is exposed to the magnetic field produced by the current $I_m$ and the magnetic field produced by the pre-magnetizing current $I_v$ and is alternately controlled in both directions of saturation. The magnetic field comparing means is a magnetic film which may be anisotropic, operated in the magnetic preferential direction, and have a thickness of at most a few microns. It may be secured to pole shoes of a magnetic core or arranged between a flat measuring conductor and a pre-magnetizing coil of flat cross-section. The measuring transformer can be used as an input transformer in a static electricity meter. In a further embodiment, the output pulses can be obtained directly from the magnetic field comparing means.

7 Claims, 20 Drawing Figures

MEASURING TRANSFORMER

This is a division of application Ser. No. 918,446 filed June 23, 1978.

BACKGROUND OF THE INVENTION

1. Field of the Invention

The invention relates to a measuring transformer for the potential-free measurement of currents or voltages, and to a static electricity meter including such a transformer.

2. Description of the Prior Art

FIG. 1 shows a known measuring transformer which comprises an annular magnetic core 1, a measuring conductor 2 for carrying the current $I_m$ to be measured, a pre-magnetizing winding 3 and an induction winding 4. The conductor 2 is passed through the closed magnetic circuit of the magnetic core 1, but could also be wound in a plurality of windings around the core 1, in the same manner as the pre-magnetizing winding 3.

In operation of this transformer, a pre-magnetizing current $I_v$, which is preferably of a triangular waveform and which flows through the pre-magnetizing winding 3, produces a magnetic field which alternately drives the magnetic core 1 in both saturation directions, the magnetic core 1 operating as a magnetic field comparing means. If the current $I_m$ to be measured is of zero value, a symmetrical induction voltage $U_a$ is induced in the induction winding 4, and this induced voltage substantially comprises positive and negative pulses which occur at the moment of magnetism reversal of the magnetic core 1 and which follow at equal spacings in time. If, on the other hand, the instantaneous value of the current $I_m$ is greater than zero, then this current assists the magnetizing effect of the pre-magnetizing current $I_v$, whereby there is a temporal displacement of the positive and negative pulses of the induction voltage $U_a$. This temporal displacement can be evaluated as a measurement of the strength and direction of the current $I_m$ to be measured. The induction winding 4 is not absolutely necessary, as a voltage is also induced in the pre-magnetizing winding 3, and the variation of that voltage in time can be used in the same way as a measurement with respect to the current $I_m$.

A known measuring transformer supplies an induction voltage $U_a$ whose pulses are relatively wide and have shallow flank angles of inclination. Moreover, the addition of the magnetic fluxes or magnetic fields which are involved, in the region of saturation of the magnetic core 1, is difficult to control, and this results in a complicated winding structure or costly compensation operations. In addition, the temporal displacement of the pulses relative to the passage through zero of the magnetic field is relatively great. This situation is altered only to a minor extent if the magnetic core 1 has a reduced portion, to reduce the saturation field strength. This known measuring transformer is therefore not suitable for the precision measurement of currents which vary rapidly.

SUMMARY OF THE INVENTION

One object of the invention is to provide a measuring transformer of the kind set out above, whose magnetic field comparing means is virtually delay-free.

Another object of the invention is to provide a measuring transformer of the kind set out above, whose output pulses mark the moment of the passage through zero of the magnetic field, clearly and with a high degree of accuracy.

According to the present invention there is provided a measuring transformer for the potential-free measurement of one of current and voltage, the transformer comprising a measuring conductor for carrying a current to be measured, a pre-magnetizing winding for carrying a pre-magnetizing current, and a magnetic field comparing means which is exposed to the magnetic field produced by the current to be measured and to the magnetic field produced by the pre-magnetizing current and is alternately controlled in both directions of saturation by the magnetic field produced by the pre-magnetizing current, said magnetic field comparing means being a magnetic film of very small thickness in comparison with its length and width.

According to the present invention there is also provided a static electricity meter including an input measuring transformer for the potential-free measurement of current, said transformer comprising a measuring conductor for carrying the current to be measured by the meter, a pre-magnetizing winding for carrying a pre-magnetizing current, and a magnetic field comparing means which is exposed to the magnetic field produced by the current to be measured and to the magnetic field produced by the pre-magnetizing current and is alternately controlled in both directions of saturation by the magnetic field produced by the pre-magnetizing current, said magnetic field comparing means being a magnetic film of very small thickness in comparison with its length and width.

According to a further embodiment of the present invention, the output pulses of the measuring transformer can be directly obtained from the magnetic field comparing means.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 2:
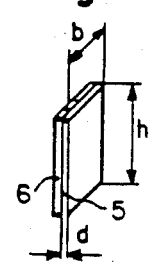
FIG. 2 shows a magnetic film applied to a substrate.

In FIG. 2, reference numeral 5 denotes a preferably anisotropic magnetic film whose thickness d is very small in comparison with the length h and the width b.

This magnetic film 5 which serves as a magnetic field comparing means, is preferably applied to a non-magnetic substrate 6 which imparts thereto the necessary mechanical strength and which comprises for example a glass or plastic plate. The film 5 may be applied to the substrate 6 in accordance with known methods by vapor deposition in vacuum or by electrolytic coating. The film 5 can also be, for example, a foil which is produced by rolling and which is secured to the substrate 6 by adhesive. Suitable materials for the film 5 are, for example, known NiFe or NiFeCr magnetic alloys.

The anisotropic magnetic film 5 can be operated in the measuring transformers described in greater detail hereinafter, in principle in the magnetic preferential direction or in the non-preferential direction. When operating in the preferential direction, the coercive field strength of the magnetic film 5 should be as low as possible and the wall speed should be high. As low an isotropic field strength as possible is advantageous when the magnetic film 5 is operated in the non-preferential direction. The description of the function of the embodiments described hereinafter relates to operation in the magnetic preferential direction which has been found particularly advantageous.

Figure 1:
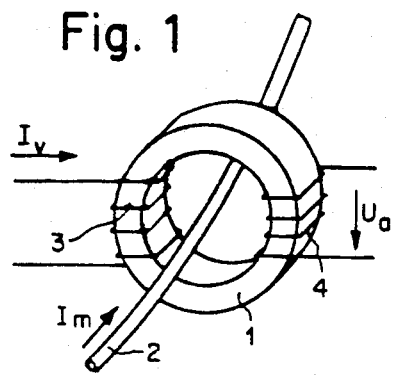
FIG. 1 shows a known measuring transformer, referred to above.
Figure 3:
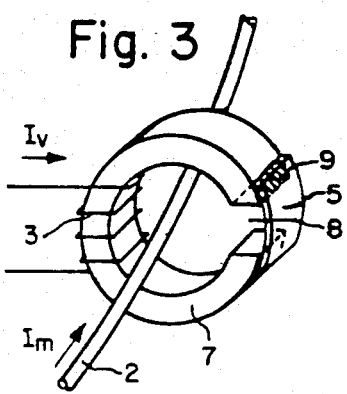
FIGS. 3 to 7 show respective different embodiments of measuring transformers with magnetic cores.

In FIG. 3, the same components as in FIGS. 1 and 2 are denoted by the same reference numerals. A magnetic core 7 which comprises ferromagnetic material of high permeability again carries the pre-magnetizing winding 3 and engages in a tong-like configuration around the measuring conductor 2, but differs from the magnetic core 1 of FIG. 1 by an air gap 8 which is bridged by the magnetic film 5. The two longitudinal ends of the film 5 are secured, for example by adhesive, to the magnetic core 7, on the outer surface thereof. The magnetic film 5 is advantageously substantially longer than the air gap 8 so as to give the largest possible contact surfaces 9 between the magnetic core 7 and the magnetic film 5. If the magnetic film 5 is arranged on a substrate 6 (FIG. 2), the substrate (which is not shown in FIG. 3 for the sake of improved clarity of the drawing) is advantageously disposed on the outside surface of the magnetic film 5, which is remote from the magnetic core 7, so that there is no air gap at the contact surfaces 9 between the magnetic core 7 and the film 5. The width of the film 5 approximately corresponds to that of the magnetic core 7.

The above-described transformer operates as follows:

In the rest-condition the magnetic film 5 is saturated and its permeability corresponds to that of a vacuum. By virtue of the current $I_m$ to be measured and the pre-magnetizing current $I_v$ which flow through the magnetic core 7, a magnetic outer field $H_a$ is built up in the air gap 8 where the magnetic film is disposed, and the following equation applies to the field $H_a$, assuming ideal conditions:

$$H_a = \frac{n_v \cdot I_v + n_m \cdot I_m}{l}$$

where $n_v$ represents the number of windings of the pre-magnetizing winding 3, $n_m$ represents the number of windings of the measuring conductor 2, and l represents the length of the air gap 8. As soon as the outer field $H_a$ exceeds the wall movement field strength of the magnetic film 5, a magnetism reversal process begins in the magnetic film 5, and this process may be explained by the displacement of a Bloch wall. This displacement occurs very rapidly so that the magnetization zero in the magnetic film 5 in relation to the condition $H_a=0$ occurs, with only a very small delay. In this time interval the permeability of the magnetic film 5 is very high, the magnetic circuit is closed to the maximum extent by way of the magnetic film and the magnetic flux in the magnetic circuit rises steeply. This change in the magnetic flux is revealed in a steep jump in voltage in the pre-magnetizing winding 3 and possibly in an induction winding 4 (FIG. 1). Thereafter the magnetic film 5 is saturated in the other direction, its permeability again corresponds to that of a vacuum, and the Bloch wall has passed through the entire width of the magnetic film 5.

The following relationship applies for the effective magnetic field $H_{eff}$ which switches the magnetic film 5:

$$H_{eff} = \frac{n_v \cdot I_v + n_m \cdot I_m}{l\left(1 + \frac{L}{l \cdot \mu_r}\right)} - \frac{a \cdot 4\pi M_s}{A \cdot \mu_o} \cdot \frac{L}{l \cdot \mu_r}$$

wherein L is the length of the magnetic circuit in the magnetic core 7, A is its cross-sectional area, a is the cross-sectional area of the magnetic film 5, $M_s$ is the saturation magnetization of the magnetic film 5, $\mu_o$ is the absolute permeability, and $\mu_r$ is the relative permeability of the magnetic core 7. The proportionality relationship:

$$H_{eff} \sim (n_v I_v + n_m I_m) = \Sigma I$$

is fulfilled if the second term in the above equation for $H_{eff}$ disappears, that is to say, the relationship becomes:

A >> a and/or $l \cdot \mu_r$ >> L.

Observing the second inequality also provides the greatest possible proportionality factor k=(1/l) between $H_{eff}$ and $\Sigma I$, because the following relationship then applies:

$$1 >> \frac{L}{l \cdot \mu_r}$$

The current $I_m$ to be measured and the pre-magnetizing current $I_v$ are therefore converted into precisely proportional magnetic fields at the location of the magnetic film 5 which operates as a magnetic field comparing means, this being effected by way of the magnetic flux in the magnetic core 7. The moment of the passage through zero of this magnetic field is marked clearly and with a high degree of accuracy by an output pulse which is very steep and which has a minimal delay relative to the occurrence $\Sigma I=0$. In addition, the position in time of the output pulse is substantially independent of the angle at which the currents $I_m$ and $I_v$ cross in the current-time diagram.

The above-mentioned advantages are based on the particular magnetic properties which can be achieved with a very thin magnetic film, namely a small dynamic coercive field strength, a high switching speed of the magnetic film, low eddy current losses, low saturation field strength, low demagnetization (shift), low degree of dispersion of the magnetic properties within the small and thin magnetic film by virtue of high metallurgical purity and homogeneity, and high uniaxial anisotropy.

The thickness d of the magnetic film 5 should be at most a few microns, in order to keep the saturation field strength, demagnetization, and eddy current losses as low as possible. A greater film thickness does in fact result in a greater energy content of the output pulses, but has its effect in particular in a widening in time and not in an increase in voltage of the output pulses. The film thickness d is, in a particularly advantageous aspect, at most 2 microns; this gives negligible eddy current losses in the magnetic film 5 and thus a switching speed which is limited only by material parameters of the magnetic film, such as wall mobility, purity, and the like.

Other advantages of the above-described measuring transformer lie in the ease of production and the resistance of the mechanical parameters in regard to mechanical loadings, in the freedom from magnetostriction, the possiblity of continuous manufacture, and the way in which the magnetic film 5 can be secured without problem, by adhesive and the like.

Figure 4:
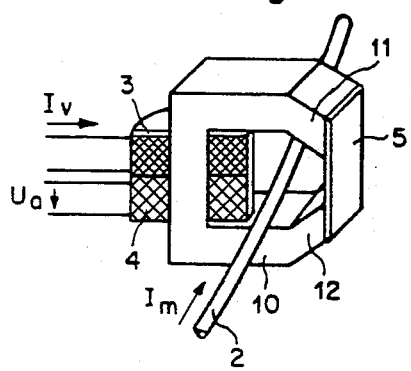
Figure 5:
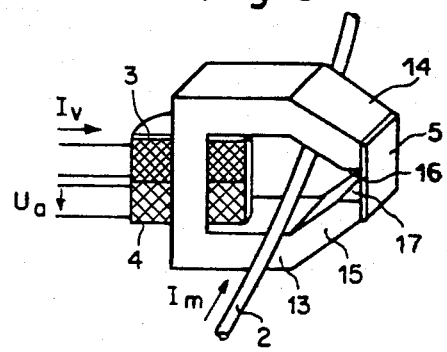
Figure 6:
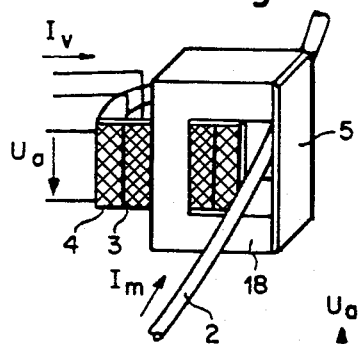
Figure 7:
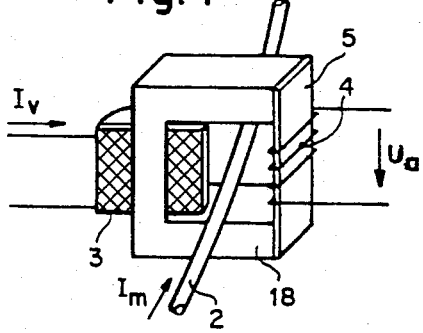

FIGS. 4 to 7 show advantageous forms of the pre-magnetizing winding 3, the induction winding 4 and the magnetic core, which can be substantially combined together. In FIGS. 4 to 6, the pre-magnetizing winding 3 and the induction winding 4 are in the form of cylindrical coils which are arranged axially one beside the other in FIGS. 4 and 5 and concentrically in FIG. 6. In FIG. 7, the induction winding 4 passes around the magnetic film 5 in the region of the air gap, whereby cross-talking of the pre-magnetizing current $I_v$ to the induction winding 4 is substantially prevented.

The magnetic core 10 shown in FIG. 4 comprises a U-shaped member with inwardly bent pole shoes 11 and 12, the magnetic film 5 being secured to the pole surfaces of the pole shoes 11 and 12, which surfaces lie in a common plane. The magnetic core 13 shown in FIG. 5 also comprises a U-shaped member with inwardly bent pole shoes 14 and 15, but in this case the inner surfaces 16 and 17 of the ends of the pole shoes 14 and 15 again extend parallel to the limbs of the U-shaped member. This makes it possible to avoid saturation phenomena in the pole shoes 14 and 15.

The U-shaped magnetic core 18 shown in FIGS. 6 and 7 does not have any pole shoes; the length of the air gap approximately corresponds to the coil width of the pre-magnetizing winding 3.

In the above-described measuring transformers, the number of windings $n_v$ of the pre-magnetizing winding 3, the number of windings $n_s$ of the induction winding 4 and the length l of the air gap 8 (FIG. 3) may be selected substantially independently of each other. The pre-magnetizing current $I_v$ whose amplitude is advantageously not greater than some ten milliamps, in order to avoid expensive apparatus for the production thereof, is adapted to the measuring current $I_m$, with the number of windings $n_v$. The number of windings $n_s$ determines the magnitude of the induced output voltage $U_a$. The field strength $H_a$ produced in the air gap 8 is determined by the selection of the air gap length l.

Figure 8:
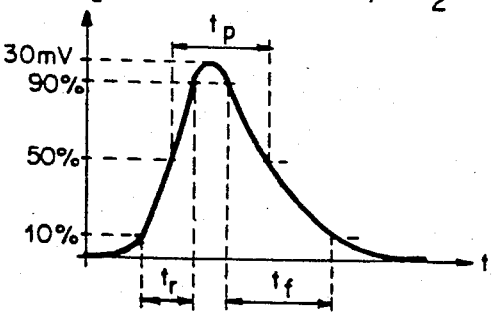
FIG. 8 shows a pulse diagram.

FIG. 8 shows the form of the output voltage $U_a$ against time t, which was determined in a measuring transformer as shown in FIG. 4, with the following data:

Material of the magnetic core 10: Ferrite
Material of the magnetic film 5: NiFe
Length h of the magnetic film 5: 5 mm
Width b of the magnetic film 5: 1 mm
Thickness d of the magnetic film 5: 1.5 micron
Length l of the airgap: 1 mm
Number of windings $n_v$ of winding 3: 250
Number of windings $n_s$ of winding 4: 250
Amplitude of the current $I_v$: 20 mA
Frequency of the current $I_v$: 1 kHz Measurements were effected with an amplitude of the output pulse of 30 mV, a rise time $t_r$ of 5 μs, a decay time $t_f$ of 11 μs and a pulse duration $t_p$ of 10 μs.

Figure 9:
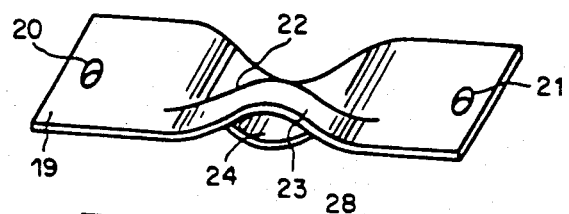
FIGS. 9 and 10 show current dividers for the current to be measured.
Figure 10:
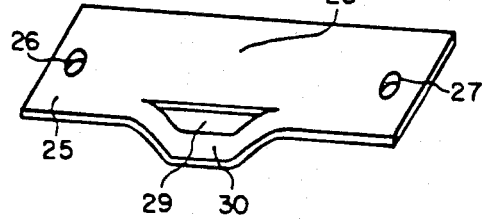

In order to be able to measure very high currents with the measuring transformer, while nonetheless keeping the number of windings $n_v$ and the pre-magnetizing current $I_v$ within acceptable limits, it may be advantageous for the current to be measured to be divided by means of a current divider into the current $I_m$ and a shunt current. FIGS. 9 and 10 show advantageous examples of such a current divider.

The current divider 19 shown in FIG. 9 comprises a single metal plate which has current connections 20 and 21, and a cut 22 which extends longitudinally relative to the direction of current flow and which divides the middle region of the metal plate into a measuring current path 23 and a shunt current path 24. The two current paths 23 and 24 are bulged outwardly in opposite directions to a semicircular form and form an eye into which the magnetic core 7, 10, 13 or 18 can be inserted in such a way that the magnetic circuit of the magnetic core encloses the measuring current path 23.

FIG. 10 shows a current divider 25 which also comprises a single metal plate which however in this case is flat, provided with current connections 26 and 27, a shunt current path 28 and a measuring current path 30 which is separated from the current path 28 by a punched-out portion 29. In this embodiment the magnetic core 7, 10, 13 or 18 is inserted into the portion 29 so that the magnetic circuit of the magnetic core encloses the measuring current path 30.

Making the current divider 19 or 25 in the form of an integral metal plate ensures a constant current divider ratio which is independent of ambient influences. The phase displacement caused by the current divider 19 or 25 respectively:

$$\phi = \arctan \frac{\omega L}{R}$$

($\omega$=circuit frequency, L=inductance of the transformer, R=resistance of the measuring current path 23 or 30) can be kept small if the metal plate is of small cross-section, and thus the measuring current path is of high resistance R, and the inductance L is as small as possible, by suitable dimensioning of the measuring transformer. A certain degree of compensation for the phase displacement $\phi$ is already achieved by the finite switching speed of the magnetic film 5; any additional compensation which may be necessary can be achieved with simple phase displacer members or by covering the shunt path 24 or 28 by a soft-magnetic layer of suitable thickness.

As already mentioned, in the above-described measuring transformers, conversion of the current $I_m$ and the pre-magnetizing current $I_v$ into proportional magnetic fields is effected by way of the magnetic flux in a magnetic core. Some embodiments are described hereinafter, in which the current $I_m$ and the pre-magnetizing current $I_v$ are converted directly to proportional magnetic currents at the position of the magnetic film 5, so that no magnetic core is required.

Figure 11:
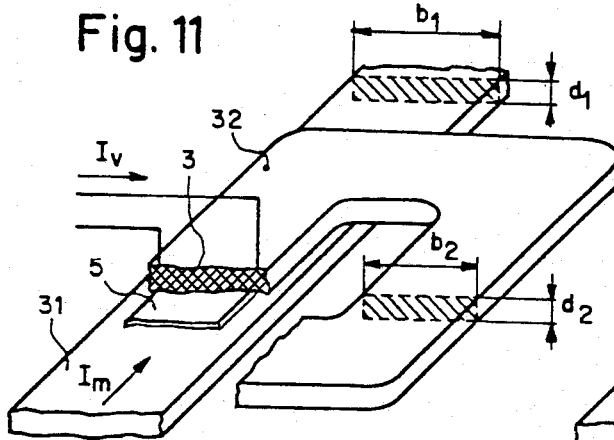
FIGS. 11 to 13 show respective different embodiments of measuring transformers without magnetic cores.

In FIG. 11, a measuring conductor 31 for carrying the current $I_m$ to be measured is in the form of a flat conductor. The pre-magnetizing winding 3 is formed by a disc-shaped flat coil 32. The magnetic film 5 is arranged between the conductor 31 and a part, parallel thereto, of the flat coil 32, in a region in which both the magnetic surface field of the conductor 31, which is produced by the current $I_m$, and also the magnetic surface field of the flat coil 32, which is produced by the pre-magnetizing current $I_v$, are uniform. Such a region of uniform magnetic field, which region is solely dependent on geometric factors, can be provided if the conductor 31 and the part of the flat coil 32 which is parallel thereto are as closely adjacent as possible and have the flattest possible cross-section, that is to say, a thickness $d_1$ or $d_2$ which is small in comparison with the width $b_1$ or $b_2$, respectivly.

The flat coil 32 can be made in the form of a self-supporting coil of strip or of wire, with one or more windings for each coil winding layer. In addition, the flat coil 32 may comprise one or more conductor plates which have a spiral copper layer on one or both sides, in the manner of an etched printed circuit. The magnetic film 5 can be secured for example directly to the measuring conductor 31 by adhesive.

Figure 12:
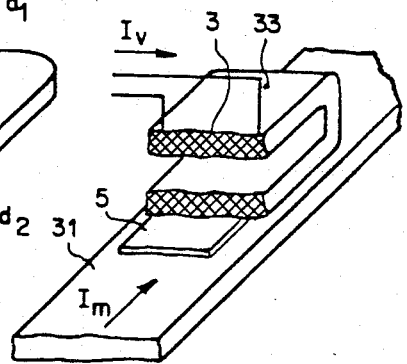

The transformer shown in FIG. 12 differs from that shown in FIG. 11 only insofar as the pre-magnetizing winding 3 is formed by a flat cylindrical coil 33, while the magnetic film 5 is disposed between the conductor 31 and one flat side of the coil 33. At the position of the magnetic film 5, the magnetic outer field of the coil 33 and the magnetic surface field of the conductor 31 are superimposed upon each other.

Figure 13:
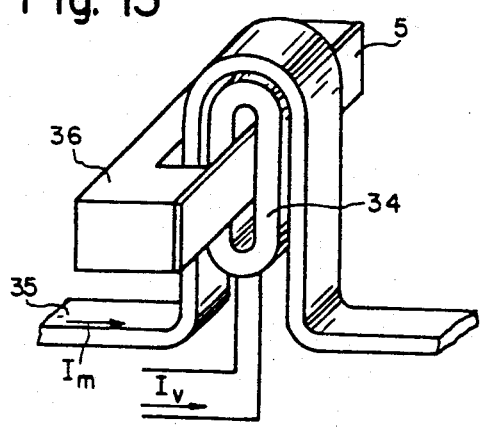

In FIG. 13, a flat cylindrical coil 34 forms the pre-magnetizing winding and passes around the magnetic film 5. A flat conductor 35 which carries the current $I_m$ passes in a loop around the flat cylindrical coil 34. The magnetic inner field of the coil 34 and that of the loop formed by the conductor 35 are superimposed on each other at the location of the magnetic film 5. A magnetic short circuit 36 comprising a material with a high degree of permeability provides for a magnetic connection between the two opposite ends of the magnetic film 5 which projects out of the coil 34, and thereby reduces demagnetization of the magnetic film 5.

The above-described measuring transformers are used for the potential-free measurement of direct or alternating currents. By series connection of a high-value resistance with the measuring conductor, by replacing the measuring conductor by a winding with a suitably high number of windings, or by combining the two possibilities just mentioned, they can also be used for measuring direct or alternating current voltages. They provide very steep and narrow output pulses whose displacement in time can be used as a measurement of the instantaneous value of the magnitude and direction of the electrical signal to be measured. The above-described measuring transformers are advantageously used as input transformers in static electricity meters.

In the measuring transformers described above, with the moment of passage through zero of the magnetic field, produced by the pre-magnetizing current and the current to be measured, an output inpulse is induced in the pre-magnetizing winding or in a separate induction winding, thus marking the passage through zero of the magnetic field with great accuracy. However, said transformer has a disadvantage in that the pre-magnetizing winding or the induction winding, from which the output inpulse is obtained, is inductively coupled with the measuring conductor. High frequency interference signals, flowing in the measuring conductor, are therefore inductively transferred to the pre-magnetizing winding, serving as the output winding, where they are superimposed on the output impulses. In an evaluating circuit, connected to the measuring transformer, such interference signals cannot be readily differentiated from the output signals making the passage through zero of the magnetic field. A suppression of the interference signals in the evaluating circuit is not possible if the spectrum of said signals is the same as that of the output impulses, or is in the proximity thereof.

In a further embodiment of the instant invention the output pulses can be directly obtained from the magnetic field comparing means. As great an insensitivity as possible to interference signals is achieved with the measuring transformer in accordance with this further embodiment. A change in resistance of the magneto-resistive magnetic film occurs only at the moment of passage through zero of the magnetic field. To have any effect at all, the interference signals must either occur in the proximity of this moment, or must be very strong in order to bring about a change in the magnetizing direction of the magnet film, which is statistically less probable than the above-mentioned case of interference. A further advantage is that the pre-magnetizing current in the magneto-resistive magnetic film does not give rise to an interference signal which superimposes itself on the output impulses obtained at the contacts of said magnetic film. This also affords the advantage that the pre-magnetizing current does not have to obey a continuous function, but can be a step-shaped signal, for example.

Figure 14:
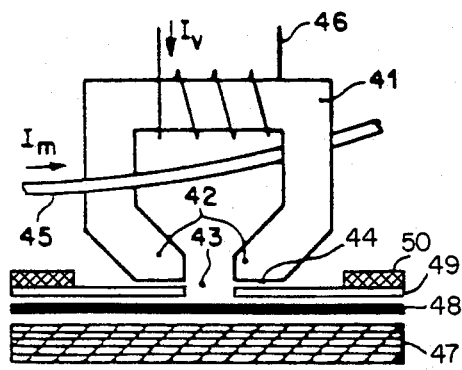
FIG. 14 shows a further embodiment of a measuring transformer.

Referring to FIG. 14, reference numeral 41 indicates a magnetic core of ferromagnetic material whose magnetic circuit encloses the air gap 43 between two pole shoes 42, whereby the pole surface 44 of the pole shoes 42 lie in a common plane. The magnetic core 41 engages in a tong-like configuration around the measuring conductor 45 which carries the current $I_m$ to be measured. Moreover, the magnetic core 41 carries a pre-magnetizing winding 46 through which, for example, a triangular-shaped pre-magnetizing current $I_v$ flows.

The following described parts of the measuring transformer are drawn in an exploded view in FIG. 14 to give better lucidity. A magnetic film 48 of ferromagnetic, magneto-resistive material, whose thickness is very small in comparison with its length and width, is arranged on a non-magnetic, electrically insulating substrate 47. Said film is advantageously magnetic, anisotropic or uniaxial. The magnetic film 48 may be applied to the substrate 47 in accordance with known methods by vapor deposition in vacuum or by electrolytic coating. Photo-lithographic methods can be used, for example, for design purposes. NiFe alloys and triples derived therefrom (e.g., NiFeCr or NiFeCo) or higher alloys are preferably suited as magneto-resistive materials. The active length and width of the magnetic film 48 corresponds to the dimensions of the air gap 43, e.g., each 1 mm. The typical thickness of the magnetic film 48 lies in the order of 40 nm. In order to avoid extremely low values for the thickness of the magnetic film 48 and nevertheless to achieve suitably high resistance values for detection of the change in resistance, the magnetic film can be formed in a meander-like design. The longitudinal ends of the magnetic film 48 are coated, for example, with a 100 nm thick conducting layer 49 of gold, copper or the like, the outer ends of which each carry a contact 50 made of a good conducting material. The pole surfaces 44 of magnetic core 41 lie above the conducting layer 49 so that the magnetic film 48, which practically lies on a plane with the pole surfaces, bridges the air gap 43. The preferential magnetic direction (easy axis) of the magnetic film 48 can lie parallel to, vertical to or, for example, at an angle of 45° to, the direction of the magnetic field in the air gap 43. The direction of the current flowing in the magnetic film 48, and produced by the current or voltage source connected to the contacts 50, is parallel to the direction of the magnetic field in the depicted example.

Figure 15:
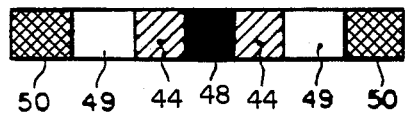
FIG. 15 shows parts of the measuring transformer of FIG. 14 in plan view.
Figure 16:
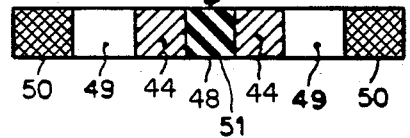
FIGS. 16 and 17 show variants of FIG. 15.

In FIG. 15 can be seen the arrangement of the magnetic film 48, the pole surfaces 44, the conducting layer 49 and the contacts 50 viewed from the side of the magnetic core 41. The above-described measuring transformer operates as follows: In the rest condition, the magnetic film 48 has a constant ohmic resistance in the order of, for example, 100Ω. A magnetic field is build up in the air gap 43 of magnetic core 41 by the current to be measured $I_m$ and the pre-magnetizing current $I_v$. The magnetic film 48 changes its resistance discontinuously at each passage through zero of said magnetic field. If a current or voltage source is connected to the contacts 50, then said change in resistance manifests itself in the form of a needle-shaped voltage or current impulse which marks the moment of passage through zero of the magnetic field unequivocally and with great accuracy. Since the magnetic film 48 is controlled up to saturation, the height of the output impulse is independent of the strength of the magnetic field. If the instantaneous value of the current to be measured $I_m$ differs from zero, then its magnetizing effect superimposes itself on that of the pre-magnetizing current $I_v$, whereby the output impulses are displaced with respect to time. This displacement with respect to time can be interpreted, in an evaluation circuit connected to contacts 50, as a measure of the strength and direction of the current to be measured $I_m$. The coupling in of the magnetic field into the magnetic film 48 is most effective when carried out in the preferential magnetic direction of the magnetic film. The change in resistance achieved thereby is at its lowest. It can be increased if, in accordance with FIG. 16, strips 51 of gold, or another material with good electrical conducting properties, are applied diagonally at 45° to the active surface of the magnetic film 48. Such a "barber's pole" arrangement of the magnetic film 48 causes the current direction in the said magnetic field to be rotated by 45°.

Figure 17:
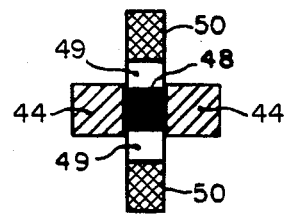

If the preferential magnetic direction of the magnetic film 48 does not run parallel to the direction of the magnetic field, but forms an angle of, for example, 90° or 45° to the magnetic field, then a crossed configuration in accordance with FIG. 17 is advantageous. In comparison with FIG. 15, in FIG. 17 the magnetic film 48, together with the conducting layers 49 and the contacts 50, are so rotated in the drawing plane that the current in the magnetic film 48 flows in a vertical direction to the magnetic field.

Figure 18:
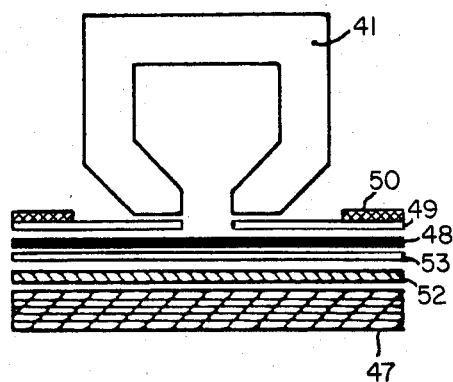
FIGS. 18 and 19 show further embodiments of a measuring transformer.

The configuration according to FIG. 18 differs from that according to FIG. 14 by virtue of a magnetic layer 52 arranged between the magnetic film 48 and the substrate 47, and insulated from said magnetic film 48 by means of a very thin insulating layer 53. The magnetic layer 52 likewise comprises a ferromagnetic NiFe alloy, but is essentially thicker than the magnetic film 48. The typical thickness of the magnetic layer 52 is 1 to 2 microns. The magnetic layer 52 also enables a good coupling in of the magnetic field when said magnetic field does not run in the preferential axial direction of the magnetic film 48. On the basis of the magnetic coupling between the magnetic layer 52 and the magnetic film 48, a large change in resistance of said magnetic film 48 results during the passage through zero of the magnetic field.

Figure 19:
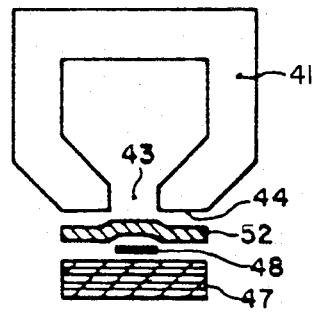
Figure 20:
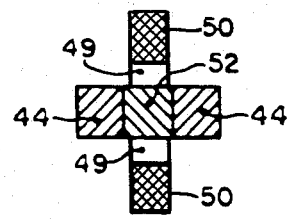
FIG. 20 shows part of the measuring transformer of FIG. 19 in plan view.

The magnetic layer 52 can be preferably applied with a crossed configuration according to FIGS. 19 and 20. With this arrangement, the magnetic film 48 is positioned in the same manner as with the crossed configuration according to FIG. 17, namely directly on the substrate 47, and said arrangement also boasts the conducting layers 49 and the contacts 50, whereby the direction of the current in the magnetic film 48 is vertical to the direction of the magnetic field between the pole surfaces 44. The preferential magnetic direction of the magnetic film 48 is likewise vertical to the direction of the magnetic field. The magnetic layer 52 rests on the pole surfaces 44, bridges the air gap 43 and crosses the magnetic film 48 at right angles. The preferential magnetic direction of the magnetic layer 52 is parallel to the direction of the magnetic field. The magnetic film 48 lies below the magnetic layer 52, whereby magnetic film 48 and magnetic layer 52 are electrically insulated from each other by means of a very thin insulating layer not shown in the drawing. As a result of the magnetic coupling between the magnetic layer 52 and the magnetic film 48, the magnetizing of the magnetic film 48 in the passage through zero of the magnetic field is rotated so that a strong change in resistance is ascertainable at the contacts 50. Preferably the magnetic film 48 forms, together with one or three resistors, a voltage divider or a bridge circuit respectively. These resistors are advantageously magneto-resistive magnetic films of the same type as magnetic film 48, so that temperature influences are compensated. Furthermore, these resistors can likewise be exposed to the magnetic field of the magnetic core 41 so that their output signals superimpose themselves in a manner as to be advantageous for the evaluation. Of course, the above-described magneto-resistive magnetic film 48, provided with contacts, can also be applied with measuring transformers in accordance with FIGS. 11 to 13 above, which have no magnetic cores.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

What is claimed is:

1. A measuring transducer for the measurement of current comprising:
   a measuring conductor for carrying the current to be measured, said conductor having a cross section wherein the thickness of said conductor is small in comparison to the width of said conductor;
   a pre-magnetizing winding for carrying an alternating pre-magnetizing current, said winding being a coil of a cross section wherein the thickness of said coil is small in comparison to the width of said coil, said coil being positioned relative to said conductor so that at least a part of said coil is closely adjacent to said conductor; and an anisotropic magnetic thin film positioned relative to said conductor and said winding in a region wherein both said current to be measured and said pre-magnetizing current produce a uniform magnetic field, said film being responsive to a magnetic flux of said current to be measured and responsive to a magnetic flux of said pre-magnetizing current to become saturated in alternate directions of magnetization corresponding to alternating direction of said pre-magnetizing current whereby the point of time of the saturation of said film is dependent on the strength of the current to be measured.

2. A measuring transducer for the measurement of current comrising:

a measuring conductor for carrying the current to be measured, said conductor having a cross section wherein the thickness of said conductor is small in comparison to the width of said conductor;

a pre-magnetizing winding for carrying an alternating pre-magnetizing current, said winding being a coil having a cross section wherein the thickness of said coil is small in comparison to the width of said coil, said coil being positioned relative to said conductor so that at least a part of said coil is closely adjacent to said conductor; and an anisotropic magnetic thin film comprising a ferro magnetic, magneto-resistive material having contact means for the connection of a current or voltage source, said film being positioned relative to said conductor and said winding in a region wherein both said current to be measured and said pre-magnetizing current produce a uniform magnetic field, said film being responsive to a magnetic flux of said current to be measured and responsive to a magnetic flux of said pre-magnetizing current to become saturated in alternate directions of magnetization corresponding to alternating directions of said pre-magnetizing current whereby the point of time of the saturation of said film is dependent on the strength of the current to be measured.

3. A measuring transducer according to claim 1 or 2 wherein said part of said coil which is closely adjacent to said conductor is also parallel to said conductor, and wherein said magnetic film is positioned between said conductor and said part of said coil which is parallel and closely adjacent to said conductor.

4. A measuring transducer according to claim 3 wherein said coil is disc shaped.

5. A measuring transducer according to claim 3 wherein said coil is cylindrical.

6. A measuring transducer according to claim 1 wherein said coil is cylindrical, said measuring conductor passing around said magnetic film.

7. A measuring transducer according to claim 6 wherein said magnetic film has two opposite ends and at least one magnetic short circuit coupling said opposite ends.

* * * * *